July 21, 1959 T. GREWE 2,896,170
OSCILLATOR CIRCUIT FOR TRANSISTORS
Filed Jan. 11, 1956 2 Sheets-Sheet 1

INVENTOR
T. GREWE

BY [signature]
ATTORNEY

July 21, 1959 T. GREWE 2,896,170

OSCILLATOR CIRCUIT FOR TRANSISTORS

Filed Jan. 11, 1956 2 Sheets-Sheet 2

INVENTOR
T. GREWE

BY [signature]
ATTORNEY

United States Patent Office 2,896,170
Patented July 21, 1959

2,896,170

OSCILLATOR CIRCUIT FOR TRANSISTORS

Theodor Grewe, Stuttgart-Bad Cannstadt, Germany, assignor to International Standard Electric Corporation, New York, N.Y., a corporation of Delaware Application January 11, 1956, Serial No. 558,587

Claims priority, application Germany January 20, 1955

11 Claims. (Cl. 331—117)

This invention relates to oscillator circuits for transistors.

As is well known, the current-amplification factor of junction transistors is less than unity. Therefore it is in general only with the aid of phase-shifting means that such transistors can be induced to oscillate. Oscillator circuits of this type are described, for example, in the book by Shea "Principles of Transistor Circuits," in particular on pages 274 to 289 thereof.

If in these arrangements the output voltage rises beyond a certain value, the collector-and-base path becomes conductive for the period of a half-wave of the current and thus acts to short the oscillatory circuit interposed between the two electrodes. This gives rise to considerable distortion factors. Hence, in a manner well known from vacuum tube oscillators, an arrangement comprising a resistance and a condenser has been employed for limiting the current flow. The phase shift that naturally occurs in the case of an audion or detector valve causes the frequency and output voltage of the oscillator to change more or less intensely whenever the load changes. The phase shifts may be diminished by enlarging the audion condenser. In this way, however, the distortion factor will be increased. The prior arrangements therefore compromise between the highest possible stability and the lowest possible distortion factor. Such compromise prevents an optimum utilization of the transistors.

Therefore an oscillator circuit for transistors is here proposed that comprises a limiter for the control current, and in which any phase shift due to load change is avoided.

According to the invention the control current is obtained from a direct current (D.C.) source over a drop resistance and is divided into two paths; one comprising a rectifier and the other path comprising the emitter-base path. The current is controlled in part by a voltage feedback and is divided into two pulsating direct currents of which the current flowing through the base-emitter path controls the transistor.

The inventive oscillator circuit is described hereafter with reference to the drawings.

Fig. 1 shows the circuit in schematic diagram.

Figs. 2 and 3 serve to explain the function.

Figure 1:
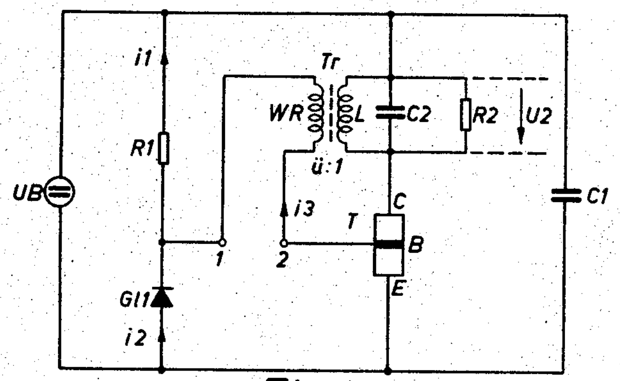
Figure 2:
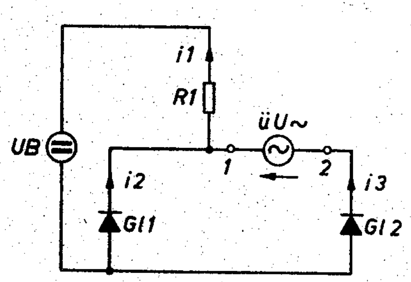

Referring to Fig. 1, T denotes a junction transistor having an emitter-base-connection. The oscillatory circuit L, C2 is included in the collector circuit. A load resistance R2 may be coupled to the transistor across the oscillatory circuit. The current flow in the collector circuit is controlled by the emitter-and-base path. According to the invention the control current is divided over a drop resistance R1 into two keyed or pulsating direct currents. One of these flows through rectifier G11. The other flows over the rectifier path constituted by the emitter and base electrodes. The changing-over between these two rectifier paths is controlled by a low alternating feedback voltage, such a $\ddot{u}U=1$ volt. The feedback voltage is connected between the emitter-and-base path, which serves as a rectifier shown as G12, and a resistance R1, as illustrated in Fig. 2. Also it is possible for the controlling feedback voltage to be applied betwen G11 and R1, or the direct current may be conducted over R1 to a tap on coil WR. The transistor is thus controlled by a square wave current so limited that the collector-to-emitter voltage shall not be reduced to zero. Hence the output circuit will be highly resistive irrespective of phase conditions, so that with the aid of the oscillatory-circuit selection the distortion factor may be made small.

Figure 3:
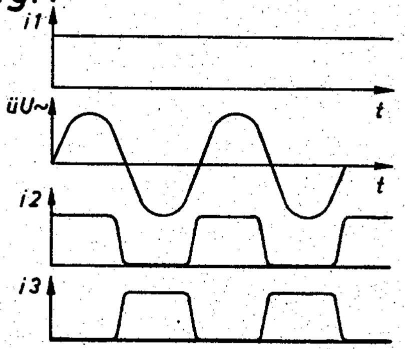

Figs. 2 and 3 illustrate schematically the mode of controlling the transistor. G12 represents the input resistance of the transistor with the transistor open. The current *i*1 flows as *i*3 over the base if the potential at point 1 is more positive than that at point 2. Conversely, with point 2 more positive than 1 the current *i*1 will flow as a current *i*2 over the rectifier G11. The potential of the base will hence be more positive than that of the emitter. The transistor will thus be in its blocking condition. Preferably the control action on the transistor is such that the alternating voltage U2 (Fig. 1, peak value), drop across load resistance R2, shall be about equal to that of the direct-voltage source UB.

With the control action normal, the A.C. resistance of the emitter-and-collector path when in its blocking condition is very high whereas it is only a little greater than R2 whenever that path is open. In this event its value depends on R1 and the transistor constants. In order to obtain a high open path resistance, so as to substantially block the transistor, it is advisable to employ the so-called grounded-base connection. This is achieved, in accordance with a further feature of the invention, by connecting a diode, or a diode and resistance in parallel with the base-and-emitter path. Also an ohmic resistance or a reactance or a combination of these may be arranged in this way. The effect so obtained can be aided by a resistance included in the emitter path.

Figure 4:
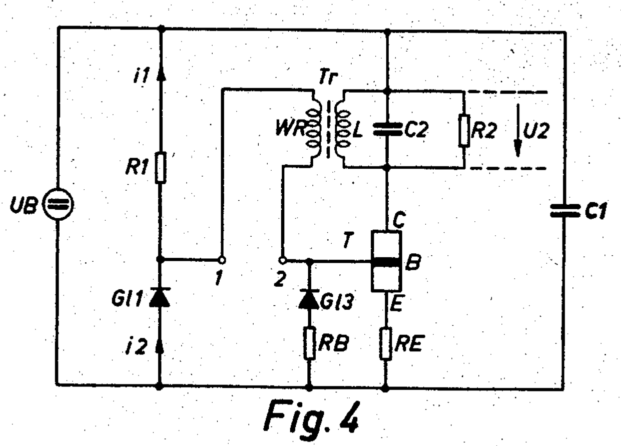
Fig. 4 represents a modification that has a passive diode included in the emitter-and-base circuit.

Fig. 4 shows an arrangement having a rectifier G13 joined in series with a resistance RB. The emitter circuit comprises an adidtional resistance RE. The other part of the arrangement is similar to Fig. 1.

The quadratic distortion-factor may be varied or compensated through a resistance included in the emitter or rectifier path.

Figure 5:
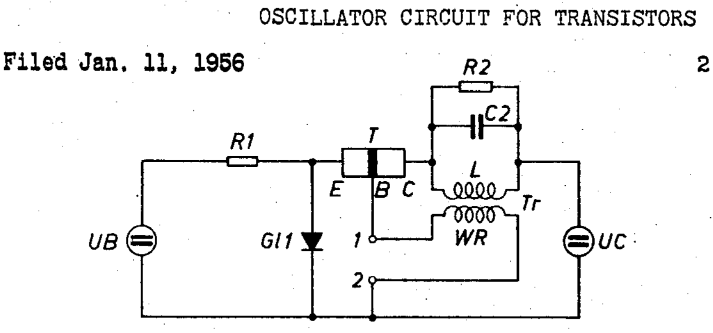
Fig. 5 shows another modification.

The example according to Fig. 5 shows another embodiment of the oscillator. Resistance R1, rectifier G11, and the feedback coil WR cause the direct current to become reversed in the same manner as that described with reference to Fig. 1. The collector circuit contains the oscillatory circuit L, C2. Connected in series with L, C2 is a second voltage source UC. In respect of function, this arrangement is similar to that shown in Fig. 1. But the arrangement of Fig. 5 has the advantage that the collector current depends very little on the amplification factor of the transistor. Accordingly the exchange of transistors will involve but a negligibly small displacement of the working point.

Figure 6:
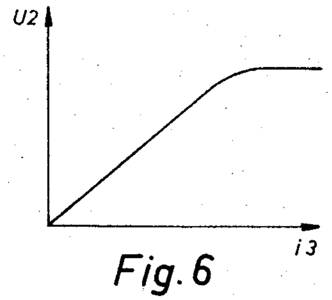
Fig. 6 illustrates the output voltage as a function of the base current.

In addition to the advantage that the load and output voltage are independent of frequency, the high frequency voltage U2 at the output rises almost proportionally to the base current *i*3, as is illustrated graphically in Fig. 6.

Figure 7:
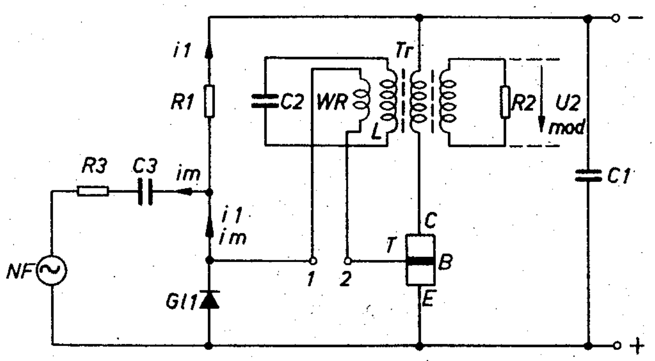
Fig. 7 represents still another modification.

Fig. 7 shows diagrammatically, and in using the arrangement represented in Fig. 1, how, for example, the modulating current is supplied. From the voltage source NF a modulating current is applied, over resistance R3 and a separator condenser C3, to the circuit of the control current *i*1. Thereby the magnitude of the alternating output voltage is caused to vary in the rhythm of the modulating frequency. This arrangement permits 100% modulation. Resistance R3 may be complex. For instance, it may be a trap circuit for the H.F. energy, in order to keep small the L.F. power requirement. In order that there may be no unwanted coupling of H.F. energy over coil WR, resistance R3 should be sufficiently high.

Fig. 7 also shows a transformer T*r* different from that represented in Figs. 1, 4, 5. In fact, the oscillatory circuit L, C2, Fig. 7, and the output circuit, having the load resistance R2 included in it, have their coils separated from a third coil of the transformer.

While I have described above the principles of my invention in connection with specific apparatus, it is to be clearly understood that this description is made only by way of example and not as a limitation to the scope of my invention as set forth in the objects thereof and in the accompanying claims.

What is claimed is:

1. An oscillator comprising a transistor having input, base and output electrodes, a resonant circuit coupled to the output electrode, means coupled to said resonant circuit for developing an alternating voltage and including, a feedback circuit comprising two branches carrying pulsating direct current, a first branch including a unidirectional current limiting device coupled to one side of said alternating voltage means, a second branch including a rectifying path through the base-input electrodes coupled to the other side of said alternating voltage means, a direct-current source, means coupling said direct-current source to said first and second branches, the magnitude of the alternating feedback voltage being sufficient to block alternately said first and second branches, whereby the output of said transistor is controlled by a pulsating direct-current passing through the rectifying path of said transistor.

2. The oscillator according to claim 1 wherein said transistor comprises emitter, base and collector electrodes, said resonant circuit being connected to said collector electrode and said rectifying path comprises the base and emitter electrodes.

3. The oscillator according to claim 1, wherein said unidirectional device comprises a rectifier, and further comprising a second rectifier connected across said emitter and base electrodes.

4. The oscillator according to claim 1 and further comprising a current-limiting resistor in the circuit between said direct-current source and said first and second branches of said feedback circuit.

5. The oscillator according to claim 3 and further comprising a resistor connected in series with said second rectifier, and a resistor connected to the emitter electrode of said transistor.

6. An oscillator comprising a transistor having input, base and output electrodes, a resonant circuit coupled to the output electrode, means coupled to said resonant circuit for developing an alternating voltage, a feedback circuit comprising two branches carrying pulsating direct current, a first branch comprising a rectifier having one terminal coupled to one side of said alternating voltage means, a second branch comprising a rectifying path through the base-input electrodes, the base electrode being coupled to the other side of said alternating voltage means, a direct-current source, the other terminal of said rectifier and the input electrode of said transistor being coupled to one terminal of said direct-current source, the other terminal of said direct-current source being coupled to said one terminal of said rectifier, and the magnitude of the alternating feedback voltage being sufficient to block alternately the rectifier and rectifying path, whereby the oscillator output of said transistor is controlled by a pulsating direct-current passing through the rectifying path of said transistor.

7. The oscillator according to claim 6 wherein said resonant circuit comprises an inductance and a capacitance connected in parallel, and said means for developing an alternating voltage comprises a coil inductively coupled to the inductance of said resonant circuit.

8. The oscillator according to claim 6, wherein said transistor comprises emitter, base and collector electrodes, said resonant circuit being connected to said collector electrode and said rectifying path comprises the base and emitter electrodes.

9. The oscillator according to claim 8, and further comprising a second rectifier connected across said emitter and base electrodes.

10. The oscillator according to claim 9 and further comprising a resistor connected in series with said second rectifier, and a resistor connected to the emitter electrode of said transistor.

11. The oscillator according to claim 6, wherein said resonant circuit comprises a capacitor and coil connected in parallel, and further comprising a load resistor connected across said resonant circuit, and a second direct-current source connected between said resonant circuit and the junction of said other terminal of said rectifier and the input electrode of said transistor.

References Cited in the file of this patent

UNITED STATES PATENTS

| | | |
|---|---|---|
| 2,745,012 | Felker | May 8, 1956 |
| 2,757,243 | Thomas | July 31, 1956 |
| 2,764,688 | Grayson et al. | Sept. 25, 1956 |